United States Patent
Schutz

[11] Patent Number: 6,136,714
[45] Date of Patent: Oct. 24, 2000

[54] METHODS FOR ENHANCING THE METAL REMOVAL RATE DURING THE CHEMICAL-MECHANICAL POLISHING PROCESS OF A SEMICONDUCTOR

[75] Inventor: Ronald Joseph Schutz, Millbrook, N.Y.

[73] Assignee: Siemens Aktiengesellschaft, Munich, Germany

[21] Appl. No.: 09/213,469

[22] Filed: Dec. 17, 1998

[51] Int. Cl.[7] .................................................. H01L 21/302
[52] U.S. Cl. ........................ 438/692; 438/693; 438/695; 438/697
[58] Field of Search .................... 438/692, 693, 438/700, 705, 697, 745, 748, 749, 754; 216/38

[56] References Cited

U.S. PATENT DOCUMENTS

| | | | |
|---|---|---|---|
| 5,084,071 | 1/1992 | Nenadic et al. | 51/309 |
| 5,700,383 | 12/1997 | Feller et al. | 438/645 |
| 5,709,588 | 1/1998 | Muroyama | 451/41 |
| 5,735,963 | 4/1998 | Obeng | 134/3 |
| 5,770,095 | 6/1998 | Sasaki et al. | 216/38 |
| 5,783,489 | 7/1998 | Kaufman et al. | 438/692 |
| 5,836,806 | 11/1998 | Cadien et al. | 451/41 |

FOREIGN PATENT DOCUMENTS

WO 97/43087 11/1997 WIPO .
WO 98/53488 11/1998 WIPO .

*Primary Examiner*—Benjamin L. Utech
*Assistant Examiner*—Binh Tran
*Attorney, Agent, or Firm*—Donald B. Paschburg

[57] ABSTRACT

A method for enhancing the removal rate of a metal barrier layer during CMP includes providing a semiconductor wafer having an insulator layer, a metal barrier layer formed on at least a portion of the insulation layer and a conductive layer formed thereon and contacting the semiconductor wafer with a chemical-mechanical polishing slurry containing a metal removal-enhancing amount of at least one chelating agent.

11 Claims, 2 Drawing Sheets

METHODS FOR ENHANCING THE METAL REMOVAL RATE DURING THE CHEMICAL-MECHANICAL POLISHING PROCESS OF A SEMICONDUCTOR

BACKGROUND

1. Technical Field

Methods for enhancing the metal removal rate during chemical-mechanical polishing (CMP) of a semiconductor wafer are described herein. More particularly, the removal rate of a metal barrier layer on a semiconductor wafer is enhanced by employing a chelating agent in the chemical-mechanical polishing slurry during chemical-mechanical polishing of the semiconductor wafer.

2. Background of Related Art

Generally, semiconductor wafers include a plurality of circuits which form an integrated circuit. At some point when fabricating the integrated circuit on the semiconductor wafer, an oxide layer is formed on the wafer. Thereafter, the oxide layer is processed to pattern trenches or openings therein. Next, a metal barrier layer such as, for example, Ti/TiW, Ti/TiN or TaSiN is formed on the oxide layer by such techniques as physical vapor deposition (PVD) or chemical vapor deposition (CVD). Finally, a conductive layer, e.g., Al, W or Cu, will be deposited within the trenches or openings and over the top surface of the barrier layer. The semiconductor wafer is then polished to level its surface. During polishing, portions of the metal barrier layer and the conductive layer are removed from the top surface of the wafer.

One known polishing process is chemical-mechanical polishing (CMP) in which the semiconductor wafer is polished by employing a chemical-mechanical polishing apparatus. As seen in FIG. 1, a chemical mechanical polishing apparatus will ordinarily include a wafer carrier 15 for holding the semiconductor wafer 10. The wafer carrier 15 can be rotated during the polishing process by motor 17. CMP polishing platen 30, which carries the polishing pad 35, can be rotated by motor 37. The polishing slurry used during the process can be applied to polishing pad 35 via conduit 40.

Generally, the chemical-mechanical polishing process will involve holding the semiconductor wafer 10 against the rotating, wetted polishing surface of polishing pad 35. The polishing slurry is used to wet the polishing surface. The slurry may include a basic or acidic solution used as a chemical etch component in combination with an abrasive, such as alumina or silica particles. A rotating polishing head or the wafer carrier 15 is typically utilized to hold the wafer 10 against the rotating polishing platen 30 under controlled pressure. A backing film is optionally positioned between the wafer carrier 15 and the wafer. The polishing platen 30 is typically covered with a relatively soft wetted pad material such as blown polyurethane.

One drawback of the CMP process is that the different materials present at the surface of the wafer may polish at different rates. These different rates of removal can result simply from the different hardnesses of the materials or from different chemical interactions between the slurry and the materials. Thus, for example, the conductive layer may be easily removed by the abrasive action and an acidic slurry, while the metal barrier layer is not subject to such removal. This unwanted, excessive isotropic removal of the conductive metal layer can leave large metal areas "dished" toward the center. Thus, the goal of achieving a flat surface comprised of metal and insulator at various locations across the wafer surface is not achieved.

U.S. Pat. No. 5,676,587 discloses a two step CMP process. The first step employs a standard alumina-based CMP slurry to remove the metal barrier layer and the conductive layer but stops before it reaches the oxide layer. The second step employs a neutral pH silica and water or silica-based CMP solution to remove the remainder of the metal barrier layer.

It would be desirable to provide an easily implemented CMP method that substantially equalizes the removal rate of the metal barrier layer and the conductive layer from a semiconductor wafer during a chemical-mechanical polishing process to provide a flat surface comprised of metal and insulator regions across the surface of the wafer or alternately it would be desirable to provide a method of enhancing the removal rate of the metal barrier layer in the aforementioned two step CMP process.

SUMMARY OF THE INVENTION

Novel methods for enhancing the removal rate of a metal barrier layer without affecting the removal rate of a conductive layer on a semiconductor wafer during CMP have been discovered which include the steps of providing a semiconductor wafer and polishing the semiconductor wafer with a CMP slurry containing a metal removal-enhancing amount of a chelating agent.

In a particularly useful embodiment, the method involves providing a semiconductor wafer having an insulator layer, a metal barrier layer formed on at least a portion of the insulator layer and a conductive layer formed thereon and contacting the semiconductor wafer with a CMP slurry containing a metal removal-enhancing amount of a chelating agent to remove the metal barrier layer and conductive layer.

In another particularly useful embodiment, the method involves providing a semiconductor wafer having an insulator layer, a metal barrier layer formed on at least a portion of the insulator layer and a conductive layer formed thereon and contacting the semiconductor wafer with a first CMP slurry and then contacting the semiconductor wafer with a second CMP slurry containing a metal removal-enhancing amount of a chelating agent to remove any remaining residual portion of the metal barrier layer and conductive layer.

DESCRIPTION OF THE PREFERRED EMBODIMENTS

The novel methods described herein involve subjecting a semiconductor wafer having an insulator layer, a metal barrier layer formed on at least a portion of the insulator layer and a conductive layer formed thereon to a CMP process. These methods are based on the discovery that a CMP slurry containing a chelating agent will enhance the removal rate of the metal barrier layer without affecting the removal rate of the conductive layer during CMP.

Figure 1:
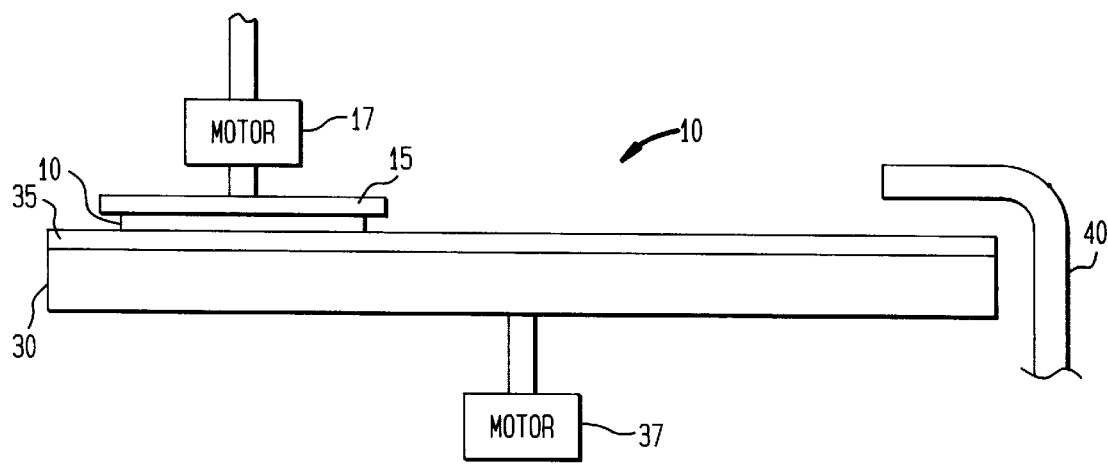
FIG. 1 shows a schematic view of a CMP polishing apparatus in accordance with the prior art.
Figure 2:
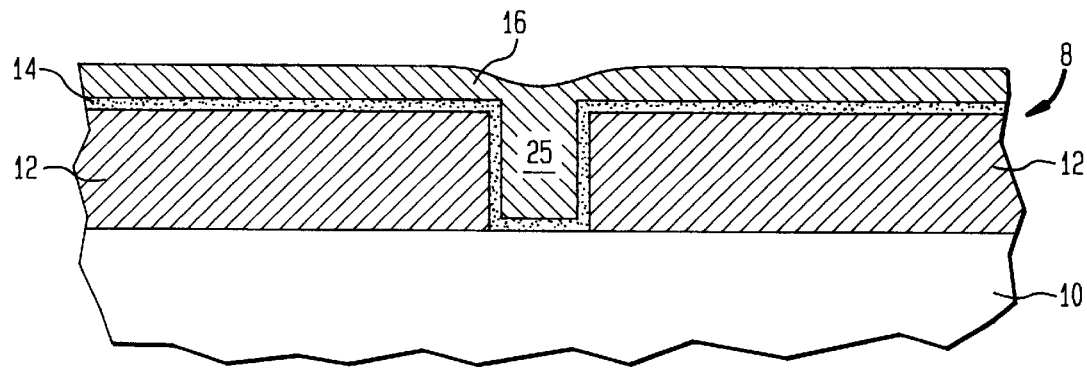
FIG. 2 is a cross-sectional view of an insulating layer with an opening formed therein on a semiconductor substrate with a metal barrier layer and conductive layer disposed thereover.

Referring to FIG. 2, the method involves providing a semiconductor wafer 8 that is of the conventional type and may contain, for example, circuitry and other interconnection levels. Generally, the semiconductor wafer 8 will include a substrate 10 having an insulator layer 12 with an opening 25 formed therein. A metal barrier layer 14 is then formed on the surface of the insulator layer 12 and within opening 25 with a conductive layer 16 being deposited over the top surface of the metal barrier layer 14 and filling opening 25. Suitable materials for the three layers 12, 14 and 16 can include any conventional material known to one skilled in the art. Preferred materials include but are not limited to $SiO_2$, PSG or BPSG for insulator layer 12, Ti/TiN for metal barrier layer 14 and Al or Cu for conductive layer 16. Techniques and parameters for forming layers 12, 14 and 16 on substrate 10 (e.g., chemical vapor deposition, physical vapor deposition, time, temperature, thickness, etc.) are within the purview of one skilled in the art.

Opening 25 can be formed in insulator layer 12 by techniques known to those skilled in the art. For example, a resist layer (not shown) can be applied to the top surface of the insulator layer 12. The resist layer is patterned and developed using known photolithographic techniques. Then etching is conducted to form opening 25, such as, by employing a suitable anisotropic etching technique, e.g., reactive ion etching. A desired width of each opening 25 will normally vary according to the current-carrying requirements for a given conductor.

Figure 4:
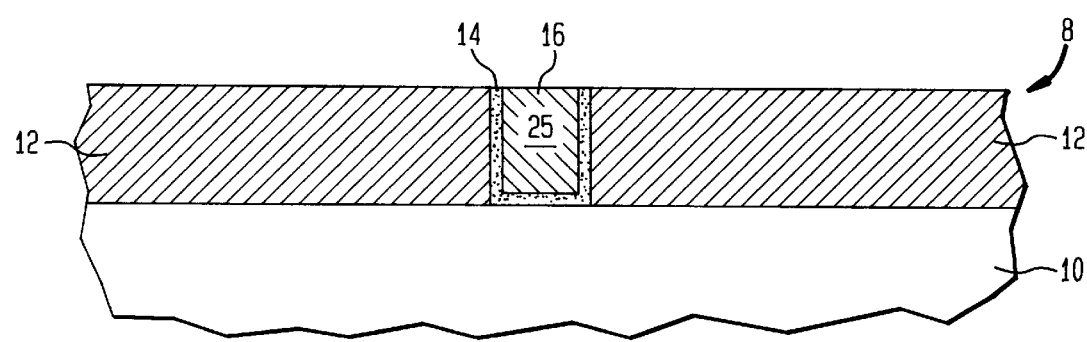
FIG. 4 shows a cross-sectional view of FIG. 3 after completion of the touchup CMP process in accordance with this disclosure.

To carry out the novel methods described herein, the semiconductor wafer 8 is subjected to a standard CMP polishing process to advantageously remove the metal barrier layer 14 and the conductive layer 16 from the top surface of the insulator layer 12 to provide a substantially planar top surface of semiconductor wafer 8 as shown in FIG. 4. In general, a CMP slurry will be used during the polishing process to remove the metal barrier layer 14 and the conductive layer 16 from the wafer 8. The slurry can be any conventional CMP slurry known to one skilled in the art. A preferred slurry for use herein include any alumina or silica based slurry, which can be basic or acidic. Conditions such as the amount of pressure and rotation speeds of the polishing platen to be used during the CMP process are within the purview of one skilled in the art.

Figure 3:
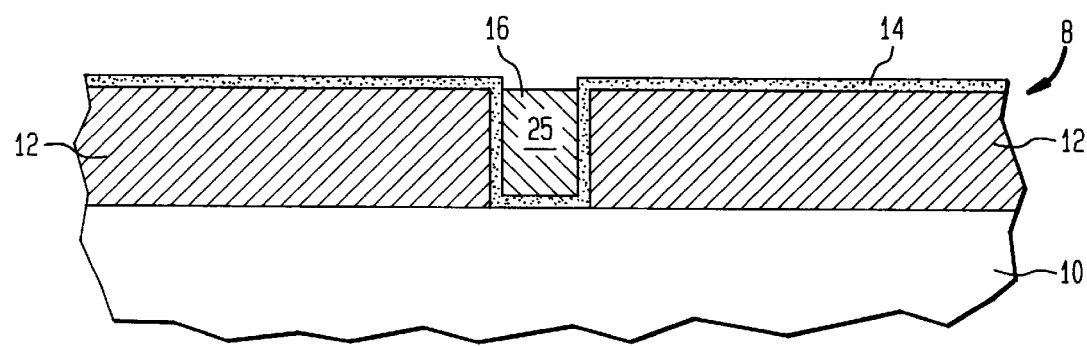
FIG. 3 shows a cross-sectional view of FIG. 2 after completion of the CMP process in accordance with this disclosure.

During the CMP polishing step, the metal barrier layer 14 polishes at a lower rate than the conductive layer 16. Thus, when the metal barrier layer 14 and conductive layer 16 are substantially removed, there can be residue of the metal barrier layer 14, e.g., Ti/TiN material, remaining on the top surface of insulator layer 12 (See FIG. 3). Accordingly, it may be necessary to conduct a second CMP processing step, generally referred to as a touchup CMP step, to remove any remaining residue from the top surface of the exposed insulator layer 12 and exposed conductive material in opening 25 to provide a substantially planar top surface of semiconductor wafer 8. (See FIG. 4).

When the CMP process is being utilized on wafer 8, a CMP slurry containing a metal removal-enhancing amount of a chelating agent is contacted with the top surface of the wafer 8, i.e., the conductive layer 16, either in the first CMP step or in the touchup CMP step. It is highly advantageous to employ a chelating agent since the chelator will not increase or decrease the pH of the slurry. The wafer 8 can be contacted with the chelator during the CMP process to substantially remove the metal barrier layer 14 and the conductive layer 16 as part of the CMP slurry or, alternatively, simultaneously with the CMP slurry during the touchup CMP step to remove any residue remaining on the top surface of wafer 8 as discussed hereinabove.

Chelating agents useful herein include polyphosphates such as sodium tripolyphosphate and hexenetaphosphoric acid; aminocarboxylic acids such as ethylenediaminetetraacetic acid (EDTA), hydroxyethylethylenediaminetriacetic acid (HEDTA), nitrilotriacetic acid (NTA), N-dihydroxyethylglycine and ethylene bis (hydroxyphenylglycine) (EHPG); 1,3-diketones such as acetylacetone, trifluoroacetylacetone and thenoyltrifluoroacetone (TTA); hydroxycarboxylic acids such as tartaric acid, citric acid, gluconic acid and 5-sulfosalicylic acid; polyamines such as ethylenediamine, triethylenediamine and triaminotriethylamine; aminoalcohols such as triethanolamine (TEA) and N-hydroxyethylethylenediamine; aromatic heterocyclic bases such as dipyridyl and o-phenanthroline; phenols such as salicylaldehyde, disulfopyroacetechol and chromotropic acid; aminophenols such as oxine, 8-hydroxyquinoline and oxinesulfonic acid; oxines such as dimethylglyoxime and salicylaldoxime; Schiff bases such as disalicylaldehyde 1,2-propylenediimine; tetrapyrroles such as tetraphenylporphin and phthalocyanine; sulfur compounds such as toluenedithiol, dimercaptopropanol, thioglycolic acid, potassium ethyl xanthate, sodium diethyldithiocarbamate, dithizone, diethyl dithiophosphoric acid and thiourea; synthetic macrocyclic compounds such as dibenzo[18]crown-6, $(CH_3)_6[14]4,11$-diene$N_4$ and (2.2.2-cryptate); polymeric chelating agents such as polyethylenimine, polymethacryloylacetone and poly(p-vinylbenzyliminodiacetic acid); and phosphonic acids, such as nitrilomethylenephosphonic acid, ethylenediaminetetra (methylenephosphonic acid) and hydroxyethylidenediphosphonic acid. Preferred chelators for use herein are ethylenediaminetetraacetic acid, hydroxyethylethylenediaminetriacetic acid, nitrilotriacetic acid, N-dihydroxyethylglycine and ethylene bis (hydroxyphenylglycine) with ethylenediaminetetraacetic acid being more preferred.

The amount of chelators contacted with the wafer 8 should be a metal removal-enhancing amount. What constitutes a metal removal-enhancing amount of chelator will depend on a number of factors including, for example, the specific chelator used, the size of the wafer 8 and the composition and surface characteristics of the wafer 8. Typically, a metal removal-enhancing amount will ordinarily range from about 0.1 to about 30 weight percent, preferably from about 1 to about 20 weight percent, and more preferably from about 2 to about 10 weight percent. When employing the chelator in the CMP slurry to remove any remaining residue, the wafer 8 should be contacted with the chelator slurry for a time period ranging from about 5 to about 300 seconds and preferably from about 20 to about 100 seconds. Though not critical, the wafer 8 should be contacted with the chelator slurry for a time ranging from about 5 to about 400 seconds, preferably from about 20 to about 300 seconds and more preferably from about 100 to about 200 seconds when removing the metal barrier layer 14 and conductive layer 16. The temperature during contact with the chelator slurry need not be precisely controlled, but normally can range from about 0° C. to about 50° C. and more preferably from about 10° C. to about 20° C.

Although the present invention has been described in preferred forms with a certain degree of particularity, many changes and variation are possible therein and will be apparent to those skilled in the art after reading the foregoing description. It is therefore to be understood that the present invention may be practiced otherwise than as specifically described herein without departing from the spirit and scope thereof.

What is claimed is:

1. A method for enhancing the metal removal rate of a metal barrier layer during chemical-mechanical polishing of a semiconductor wafer comprising the steps of:

a) providing the semiconductor wafer having an insulator layer, a metal barrier layer formed on at least a portion of the insulator layer and a conductive layer formed thereon;

b) polishing the semiconductor wafer with a first chemical-mechanical polishing slurry containing a metal removal-enhancing amount of an aminocarboxylic acid in an amount from about 0.1 to about 30 weight percent; and c) polishing the semiconductor wafer with a second chemical-mechanical polishing slurry containing the aminocarboxylic acid for removing residue.

2. The method of claim 1 wherein the insulator layer is $SiO_2$.

3. The method of claim 1 wherein the metal barrier layer is Ti/TiN.

4. The method of claim 1 wherein the conductive layer is selected from the group consisting of Al and Cu.

5. The method of claim 1, wherein the aminocarboxylic acid is selected from the group consisting of ethylenediaminetetraacetic acid, hydroxyethylethylenediaminetriacetic acid, nitrilotriacetic acid, N-dihydroxyethylglycine and ethylene bis (hydoxyphenylglycine).

6. The method of claim 1 further comprising the step of contacting the semiconductor wafer with a second chemical-mechanical polishing slurry.

7. A method for enhancing the metal removal rate of a metal barrier layer during chemical-mechanical polishing of a semiconductor wafer comprising the steps of:

a) providing the semiconductor wafer having an insulator layer, a metal barrier layer and a conductive layer formed thereon;

b) contacting the semiconductor wafer with a first chemical-mechanical polishing slurry; and c) contacting the semiconductor wafer with a second chemical mechanical polishing slurry, the second chemical mechanical polishing slurry containing a metal removal-enhancing amount of an aminocarboxylic acid in the amount of about 0.1 to about 30 weight percent.

8. The method of claim 7 wherein the insulator layer is $SiO_2$.

9. The method of claim 7 wherein the metal barrier layer is Ti/TiN.

10. The method of claim 7 wherein the conductive layer is selected from the group consisting of Al and Cu.

11. The method of claim 7, wherein the aminocarboxylic acid is selected from the group consisting of ethylenediaminetetraacetic acid, hydroxyethylethylenediaminetriacetic acid, nitrilotriacetic acid, N-dihydroxyethylglycine and ethylene bis (hydoxyphenylglycine).

* * * * *